United States Patent [19]

Kai

[11] Patent Number: 4,773,048
[45] Date of Patent: Sep. 20, 1988

[54] SEMICONDUCTOR MEMORY DEVICE HAVING EVEN AND ODD NUMBERED BANK MEMORIES

[75] Inventor: Naoyuki Kai, Tokyo, Japan

[73] Assignee: Kabushiki Kaisha Toshiba, Kawasaki, Japan

[21] Appl. No.: 14,367

[22] Filed: Feb. 13, 1987

[30] Foreign Application Priority Data

Feb. 21, 1986 [JP] Japan .................................. 61-36668

[51] Int. Cl.[4] ............................ G11C 8/00; G06F 7/00
[52] U.S. Cl. ..................................... 365/230; 364/200
[58] Field of Search .................. 365/189, 230, 210; 364/200

[56] References Cited

U.S. PATENT DOCUMENTS

| | | | |
|---|---|---|---|
| 3,402,398 | 9/1968 | Koerner et al. | 365/49 |
| 3,644,906 | 2/1972 | Weinberger | 365/49 |
| 4,163,281 | 7/1979 | Steinga | 364/200 |
| 4,429,375 | 1/1984 | Kobayashi et al. | 365/240 |
| 4,660,181 | 4/1987 | Saito et al. | 365/189 |
| 4,667,308 | 5/1987 | Hayes et al. | 365/189 |

FOREIGN PATENT DOCUMENTS 59-2079  1/1984  Japan .
61-15245 1/1986  Japan .

Primary Examiner—Terrell W. Fears
Assistant Examiner—Melissa J. Koval
Attorney, Agent, or Firm—Finnegan, Henderson, Farabow, Garrett & Dunner

[57] ABSTRACT

A semiconductor memory device comprises an address signal generator for generating address signals including row and column address signals, and an additional address signal to indicate if the column address is even- or odd-numbered; even- and odd-numbered bank memories with a plurality of word areas each including n bit areas; row decoder which in response to a row address signal, specifies the row address position in the even- or odd-numbered bank memory; and a column decoder which in response to the address signal, specifies the column address positions in the even- and odd-numbered bank memories. The column decoder responds to the address signal representing the column address 2j or (2j+1), to specify the column address position [2j] or [2j+2] in the even-numbered memory, and at the same time specifies the column address position [2j+1] in the odd-numbered bank memory.

9 Claims, 4 Drawing Sheets

:::

FIG. 3
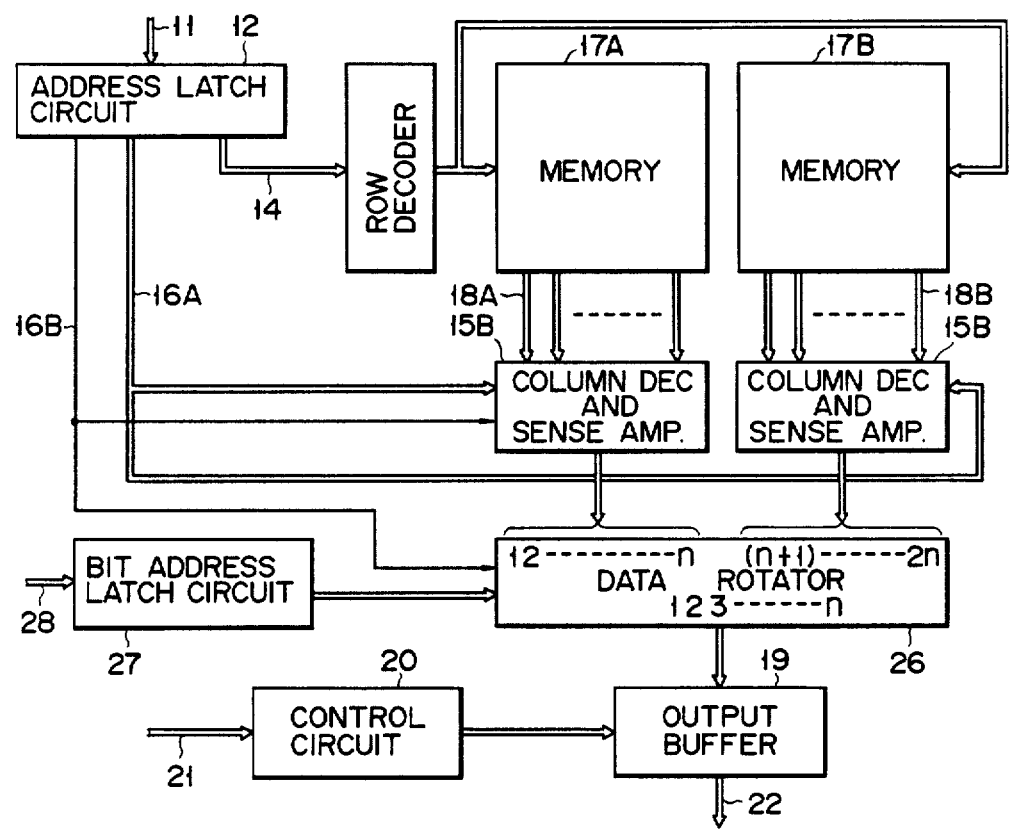
FIG. 4
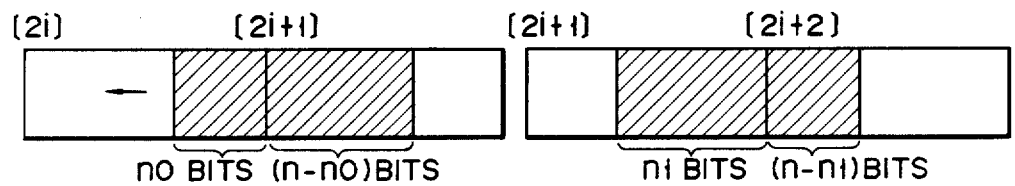
FIG. 5
FIG. 6
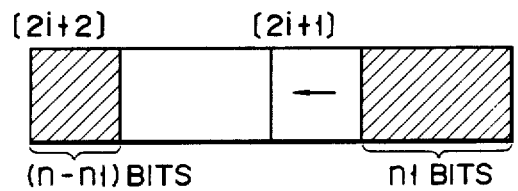

SEMICONDUCTOR MEMORY DEVICE HAVING EVEN AND ODD NUMBERED BANK MEMORIES

BACKGROUND OF THE INVENTION

This invention relates to a semiconductor memory device which can store a character pattern in desired memory locations, and which can be used as, for example, an image memory.

There has been known a semiconductor memory device which stores words each made up of a predetermined number of bits, one by one. As shown in FIG. 1, this type of semiconductor memory device comprises address latch circuit 12, row decoder circuit 13, column decoder and sense amplifier 15, and memory 17. Address latch circuit 12 latches address signals $A_0$ to $A_{m-1}$ on address bus 11. Row decoder circuit 13 decodes address signals $A_p$ to $A_{m-1}$ supplied from address latch circuit 12 via address bus 14. Column decoder and sense amplifier 15 decodes address signals $A_0$ to $A_{p-1}$ supplied from address latch circuit 12 via address bus 16. Memory cells of memory 17 are selectively designated by row decoder circuit 13 and column decoder and sense amplifier 15. N-bit data from memory 17 is supplied to output buffer 19 via $2^p \times$n-bit line 18 and column decoder and sense amplifier 15. Output buffer 19 is controlled by control circuit 20 in accordance with a control signal on control input line 21, which is supplied from an external control circuit (not shown), and outputs n-bit data supplied via column decoder and sense amplifier 15 to data output line 22.

If an m-bit address signal is used for designating one word of n bits, memory 17 contains a matrix memory cell array of $2^q$ rows$\times(2^p\times$n) columns (p+q=m). In this case, one row in memory 17 is selected by address signals $A_p$ to $A_{m-1}$. Then, from a plurality of words in the selected row, one word is selected by address signals $A_0$ to $A_{p-1}$. In this way, data is accessed, word by word, in the word area. The n bits of one word are fixed in their locations, and are accessed simultaneously.

In the semiconductor memory device used as an image memory, there are cases where image data is stored in two word areas as shown by hatched lines in FIG. 2, without any restriction by the boundary between the word areas. In such cases, an access request for the n-bit data stored in two adjacent word areas is needed. As shown in FIG. 2, a plurality of word areas WA11 to WAMN each having 0-th to (n−1)th bit areas BA1 to BAn are allotted in memory 17. For example, word area WA11 is allotted to address location X. Word areas WA12, WA1N, WA21 and WA31 are respectively allotted to address locations (X+1), (X+Y−1), (X+Y) and (X+2Y). Memory area MA which stores n-bit image data ID, includes successive "n" bit areas extending to word area WA32 at address location (X+2Y+1) and word area WA33 at address location (X+2Y+2).

In the memory device shown in FIG. 1, in reading out n-bit image data ID stored in memory area MA, memory area MA cannot be directly accessed. Some steps are needed for reading out such data. First, word areas WA32 and WA33 are accessed to read out the 2n-bit data. Then either by processing the readout 2n-bit data in an external circuit, or by processing the 2n-bit data by software, the n-bit image data is extracted. As described above, conventionally, it is possible to make a direct access to one-word data in a word area, but it is impossible to make a direct access to one-word data stored in the word areas containing a bit boundary for separating them. This leads to the decrease of data processing speed.

SUMMARY OF THE INVENTION

An object of this ivention is to provide a semiconductor memory device which can simultaneously access a plurality of bits of a word data defined by bit area boundaries, and increases the data-processing speed.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly desribed herein, the semiconductor memory device of this invention comprises an address signal generating circuit for generating address signals including row and column address signals and an additional address signal to indicate if the column address is even-or odd-numbered; even and odd numbered bank memories each having a plurality of word areas and each word area including n bit areas; a row decoder connected to said address signal generating circuit and to said even- and odd-numbered bank memories for specifying the row address positions of the even-numbered and odd-numbered bank memories means in response to the row address signal from the address signal generating circuit; a column decoder connected to said address signal generating circuit and to said even- and odd-numbered bank memories, and which responds to the column and additional address signals to specify respectively the column address position (2j) or (2j+2) in the even-numbered bank memory and the column address location (2j+1) in the odd-numbered bank memory when said column and additional address signals indicate column address (2j) or (2j+1); a control data generating circuit for generating control data representing the amount of data rotation corresponding to the number of bits less than 2n bits; and a data rotator connected to the column decoder via a number (2n) bit lines and to said control data generating circuit, and in accordance with the control data from said control data generating circuit, said data rotator selectively connecting 2n bit lines connected to the column decoder, to n input/output bit lines, thereby permitting n-bit data to be transferred between said even and odd-numbered bank memories and said n input/output bit lines via said data rotator.

In this invention, column data designates the address locations in the odd- and even-numbered bank memories, directly responding to the column address signal. Therefore, the read/write data operations for this memory can be executed at high speed.

The accompanying drawings, which are incorporated in and constitute a part of this specification, illustrate one embodiment of the invention and, together with the description, serve to explain the principles of the invention.

BRIEF DESCRIPTION OF THE DRAWINGS

FIG. 3 is a block diagram of a semiconductor memory device constructed according to one embodiment of this invention;

FIGS. 4 to 6 each show 2n-bit memory locations for illustrating the operation of the memory device in FIG. 3;

DETAILED DESCRIPTION OF THE PREFERRED EMBODIMENTS

Figure 1:
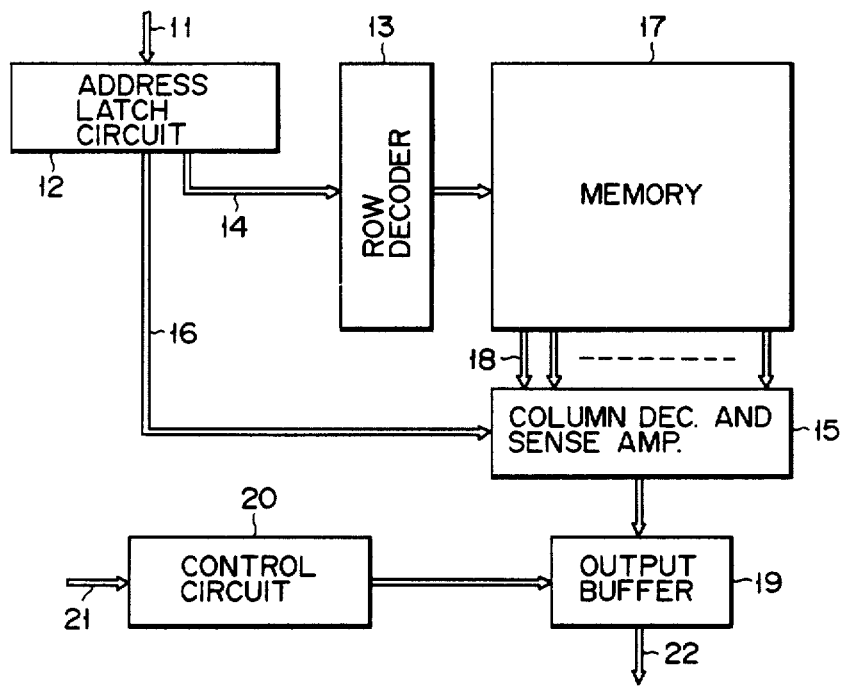
FIG. 1 is a block diagram of the prior art memory device.
Figure 2:
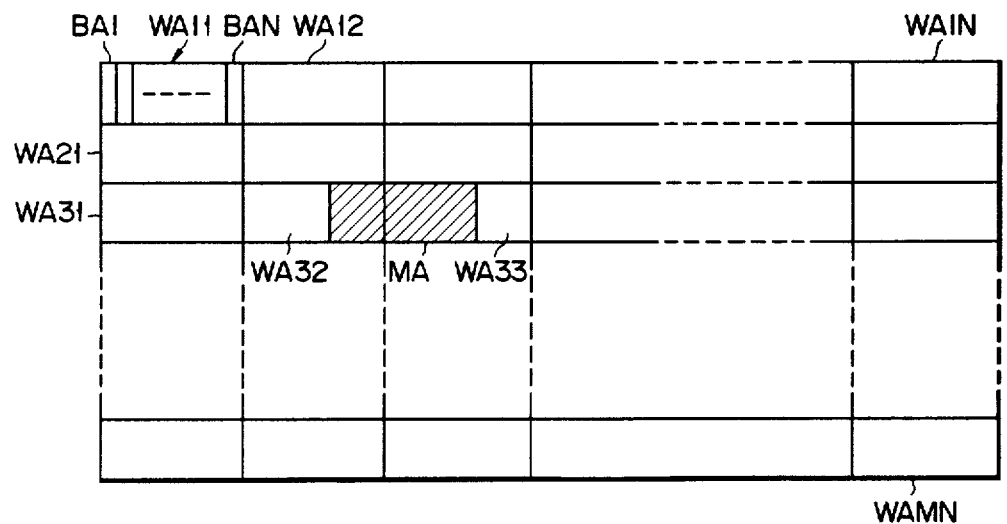
FIG. 2 shows a memory map of memory used in FIG. 1.

FIG. 3 shows a semiconductor memory device according to an embodiment of this invention. The configuration of this semiconductor memory device is almost the same as that of FIG. 1., except that memories 17A and 17B, and column decoder and sense amplifiers 15A and 15B are respectively used instead of memory 17 and column decoder and sense amplifier 15, and that data rotator 26 such as a barrel rotator is used. Memories 17A and 17B each include memory cells arrayed in a matrix of 2q rows×($2^{p-1}$×n) columns, where p+q=m, and "m" is the number of address lines, "n" the number of bits of one word. Memory 17A comprises a memory cell array of the even-numbered bank, which is accessed by an even-numbered address signal for each word. Memory 17B comprises a memory cell array of the odd-numbered bank, which is accessed by an odd-numbered address signal for each word.

Column decoders and sense amplifiers 15A and 15B are coupled with memories 17A and 17B via data bus 18A and 18B, respectively. Column decoders and sense amplifiers 15A and 15B receives address signals $A_1$ to $A_{p-1}$ from address latch circuit 12 via address lines 16A. Address signal $A_0$ from address latch circuit 12 is supplied to column decoder and sense amplifier 15A and data rotator 26 via address line 16B, and is used as a control signal for representing whether the address is odd- or even-numbered. Data rotator 26 is further supplied with output data from bit address latch circuit 27 which latches shift data supplied via bit address lines 28 from an external control circuit (not shown). Data rotator 26 extracts n-bit data from 2n-bit data from column decoders and sense amplifiers 15A and 15B, on the basis of the output data from bit address latch circuit 27 and address signal $A_0$ from address latch circuit 12, and supplies the n-bit data to output buffer 19.

Row selecting operations for memories 17A and 17B are executed in exactly the same manner as described above, by row decoder 13. However, column selecting operations are executed separately by column decoders and sense amplifiers 15A and 15B. Specifically, column decoder 15B, which is coupled to memory 17B accessed by an odd-numbered address, executes a decoding operation so as to generate bit line combinations of $2^{p-1}$, on the basis of address signals $A_1$ to $A_{p-1}$ supplied via address lines 16A. The "n" bit lines of each of bit line combinations [$B_0$] to [$B_{2^{p-1}-1}$] are selectively activated when the data receiving combined signals of $B_0$ to $B_{2^{p-1}-1}$ shown by the following expressions, and then a corresponding n-bit data is supplied to data rotator 26, $$B_0 = \overline{A_1} \cdot \overline{A_2} \cdot \overline{A_3} \cdot \ldots \cdot \overline{A_{p-1}}$$

$$B_1 = A_1 \cdot \overline{A_2} \cdot \overline{A_3} \cdot \ldots \cdot \overline{A_{p-1}}$$

$$B_2 = \overline{A_1} \cdot A_2 \cdot \overline{A_3} \cdot \ldots \cdot \overline{A_{p-1}}$$

$$B_{2^{p-1}-1} = A_1 \cdot A_2 \cdot A_3 \cdot \ldots \cdot A_{p-1}.$$

Column decoder and sense amplifier 15A executes a decoding operation to generate bit line combinations of $2^{p-1}$ on the basis of address signals $A_0$ to $A_{p-1}$ supplied via address lines 16A and 16B. The "n" bit lines of each of bit line combinations [$C_0$] [$C_{2^{p-1}-1}$] lines of each of bit line combinations [C0] to [C2p-11] are selectively activated when receiving address signal combinations $C_0$ to $C_{2^{p-1}-1}$ as shown by the following expressions, and a corresponding n-bit data is supplied to data rotator 26, $$C_0 = A_0 \cdot B_0 + \overline{A_0} \cdot B_1$$

$$C_1 = A_0 \cdot B_1 + \overline{A_0} \cdot B_2$$

$$C_r = A_0 \cdot B_r + \overline{A_0} \cdot B_{r+1}$$

$$C_{2^{p-1}-2} = A_0 \cdot B_{2^{p-1}-2} + \overline{A_0} \cdot B_{2^{p-1}-1}$$

$$C_{2^{p-1}-1} = A_0 \cdot B_{2^{p-1}-1}.$$

When even-numbered address 2K is latched by address latch circuit 12, n-bit data from the memory cells at address location [2K] is supplied from memory 17A to data rotator 26 via column decoder and sense amplifier 15A, and n-bit data from the memory cells at address location [2K+1] is supplied from memory 17B to data rotator 26 via column decoder and sense amplifier 15A. When odd-numbered address (2K+1) is latched by address latch circuit 12, n-bit data from the memory cells at address location [2K+2] is supplied from memory 17A to data rotator 26, and n-bit data from the memory cells at address location [2K+1] is supplied from memory 17B to data rotator 26.

In this way, data rotator 26 receives two n-bit data from column decoders and sense amplifiers 15A and 15B. On the basis of the data representing a shift latched by bit address latch circuit 27 and address signal $A_0$, data rotator 26 extracts a desired n-bit data from the received 2n-bit data, and outputs the n-bit data to output buffer 19. Data BA latched by bit address latch circuit 27 is given by the following expression, if the address signals are $b_0$ to $b_l$ $$BA = \sum_{i=0}^{l} b_i \cdot 2^i$$

Assume now that n-bit data is read out from the memory cells at even-numbered address location [$2i$]. In this case, address signal $2i$ including address signal $A_0$ (="0") is latched by address latch circuit 12. At the same time, bit address data representing the shift of "0" is latched by bit address latch circuit 27. As described above, in response to address signal $2i$ from address latch circuit 12, row and column decoders 13 and 15A read out n-bit data from address location [$2i$] in memory 17A. Similarly, row and column decoders 13 and 15B read out n-bit data from address location [$2i+1$] in memory 17B. In this case, column decoder 15A designates column address location [2j] in response to the address signal supplied via address lines 16A and 16B. Column decoder 15B designates address location [2j+1] in response to the address signal supplied via address lines 16A. The 2n-bit data thus read out is supplied to first and second input terminals of data rotator 26. Data rotator 26 couples the first to nth input terminals to first to nth output terminals, respectivly, in response to address signal $A_0$ of "0" and bit address data of "0". In this case, therefore, the n-bit data from column decoder and sense amplifier 15A are supplied to output buffer 19 via data rotator 26.

When n-bit data is read out from the memory cells at odd-numbered address location [2i+1], address signal $A_0$ of "1" and bit address data of "0" are respectively produced from address latch circuits 12 and 27. In this case, column decoder 15A designates column address location [2j+2] in response to an address signal supplied via address lines 16A and 16B. Column decoder 15B designates address location [2j+1] in response to an address signal supplied via address line 16A. The n-bit data at address location [2i+2] is supplied from memory 17A to data rotator 26. Similarly, the n-bit data at address location [2i+1] is supplied from memory 17B to data rotator 26. Data rotator 26 couples the (n+1)th to 2nth input terminals with the first to nth output terminals in response to address signal $A_0$ of "1" and bit address data of "0". This means that data rotator 26 rotates the 2n-bit data to a location rotated by the amount corresponding to n bits. Since data rotator 26 is a combination circuit constructed by logic gates and the like, time required for data rotation is determined by the delay time in the logic gates and is short. In this case, the n-bit data from column decoder and sense amplifier 15B is supplied to output buffer 21 via data rotator 26.

Next, a case where n-bit data stored in the even-numbered address location [2i] and the odd-numbered [2i+1] address locations is read out will be discussed. Suppose that $n_0$ bits are in the even-numbered address area, and the remaining $(n-n_0)$ bits are in the odd-numbered address area as shown in FIG. 4. At this time, address signal $A_0$ is at logical 0, and bit address data BA1 representing a shift corresponding to $(n-n_0)$ bits is latched by bit address latch circuit 27. Data rotator 26 couples the $(n-n_0)$th to $(2n-n_0)$th input terminals to first to nth output terminals, in the response to address signal of "0" and bit address data BA1. In this way, the data supplied to rotator 26 is virtually rotated to a location displaced by $(n-n_0)$ bits in the arrow direction. The $(n-n_0)$th to n-th bit at address location [2i] in memory 17A and first to $(n-n_0)$th at address location [2i+1] are supplied to output buffer 19 via the $(n-n_0)$th to $(2n-n_0)$th input terminals and first to n output terminals.

A case wherein n-bit data stored in odd-numbered address location [2i+1] and even-numbered address location [2i+2], which are adjacent to each other, are read out, will now be discussed. Suppose that, of the n-bit data, $n_1$ bits are in an odd-numbered address area, and the remaining $(n-n_1)$ bits are in an even-numbered address area, as shown in FIG. 5. In this case, address signal $A_0$ is at logical "1", and bit address data BA2 representing a shift corresponding to $(n-n_1)$ bits is stored in bit address latch circuit 27. N-bit data from column decoder and sense amplifier 15A is supplied to the first to nth input terminals of data rotator 26. Data of n bits from column decoder and sense amplifier 15B is supplied to the (n+1)th to 2nth input terminals of data rotator 26. This means that data rotator 26 is fed with 2 n-bit data in an input state shown in FIG. 6. Specifically, the first to nth bits of the n-bit data as shown by the diagonal lines in FIG. 5 are respectively supplied to the $(2n-n_1)$ to 2n input terminals. minals. Then, in response to address signal $A_0$ of "1" and bit address data BA2, data rotator 26 generates n-bits which are equal to the first to nth of the 2n-bit data obtained by rotating the input data shown in FIG. 6 in the arrow direction by $(n+n-n_1)$ bits. More specifically, in response to address signal $A_0$ of "1" and bit address data BA2, data rotator 26 connects the (2n-nl)th to 2nth input terminals to the first to the nth output terminals. By this coupling, rotator 26 allows the n-bit data shownby diagonal lines in FIG. 5 to be supplied to output buffer 19.

As described above, in the embodiment shown in FIG. 3, column decoder/sense amplifier 15A executes column select operation in response to address signals $A_0$ and $A_1$ to $A_{p-1}$ supplied via address lines 16A and 16B. In this case, column decoder/sense amplifier 15A does not perform any logical operations, but performs the same operation as that of column decoder and sense amplifier 15B. Therefore, column decoder 15A can execute the column select operation at the same speed as column decoder and sense amplifier 15B.

Data rotator 26, on the basis of address signal $A_0$ and bit address data from bit address latch circuit 27, selects the consecutive n input terminals of these first to 2nth input terminals (in this case, the first terminal is considered to succeed to the 2nth input terminal) and couples the n input terminals with the first to nth output terminals. By this coupling, any n-bit data of the 2n-bit data read out from memories 17A and 17B is allowed to be supplied to output buffer 19.

As can be understood from the foregoing, in this embodiment, any n-bit data for one word can be read at a high speed, without any restriction by the boundary between word areas.

Figure 7:
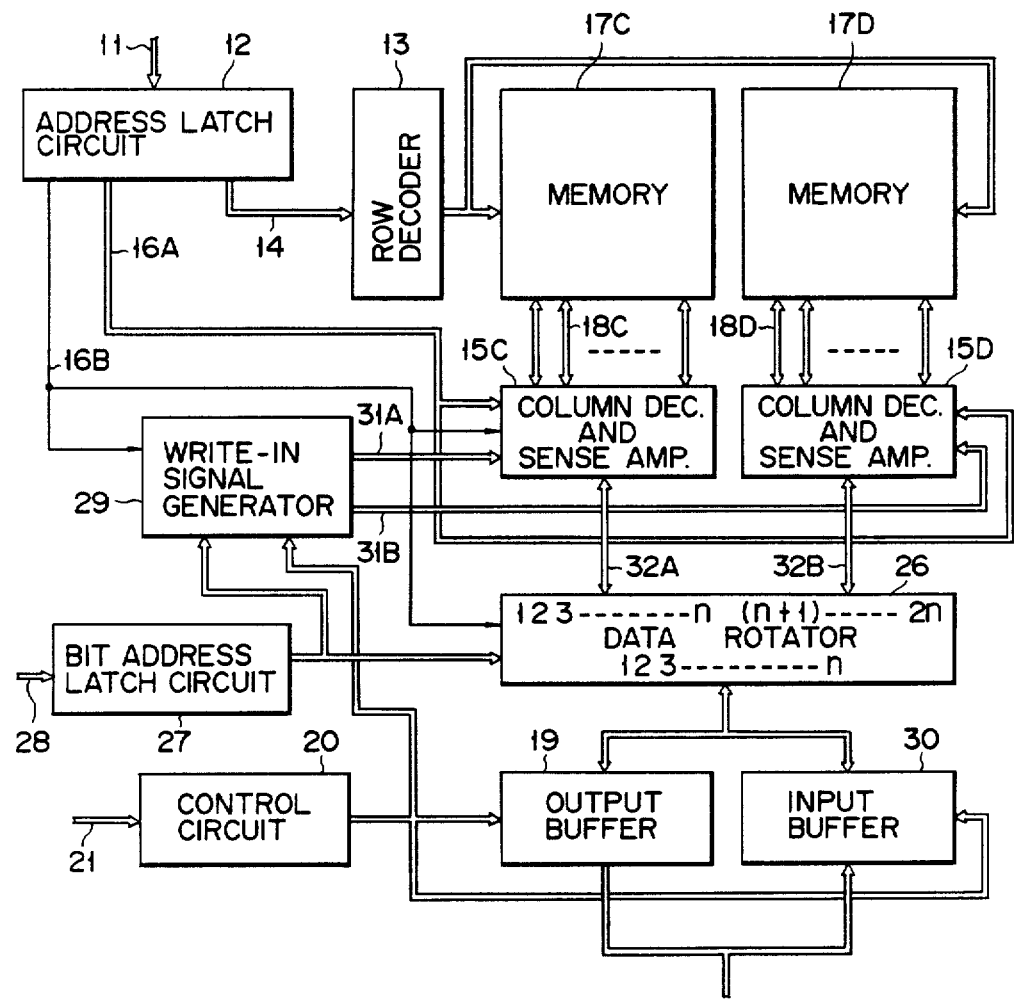
FIG. 7 is a block diagram of semiconductor memory device constructed according to another embodiment of this invention.

FIG. 7 shows another embodiment of a semiconductor memory device according to this invention. This semiconductor memory device uses erasable and programmable memories 17C and 17D instead of memories 17A and 17B. Column decoders and sense amplifiers 15C and 15D are used in place of column decoders and sense amplifiers 15A and 15B. Except for using write-in signal generator 29 and input buffer 30, the configuration of this circuit is substantially the same as that of FIG. 3.

In response to output signals of control circuit 20 and bit address latch circuit 27, and address signal $A_0$ from address latch circuit 12, write-in signal generator 29 supplies a control signal to column decoders and sense amplifiers 15C and 15D via n control lines 31A and 31B. Column decoder 15C has switching circuits which selectively connect a bit line selected from data bus 18C by address signals $A_0$ and $A_1$ to $A_{p-1}$ from address latch circuit 12, to a bit line selected from data buses 32A by a control signal supplied via n control lines 31A from write-in signal generator 29. Column decoder 15D also has switching circuits which selectively connect the bit lines from data buses 18D and 32B, in accordance with the control of address signals $A_1$ to $A_{p-1}$ and a signal on n control lines 31B.

In the read-out mode, since write-in signal generator 29 is inoperative, the n bit lines of data buses 32A and 32B are connected to the n bit lines of data buses 18C and 18D, respectively. In the write-in mode, write-in signal generator 29 is operative. In this case, n bit lines selected from the 2n bit lines of data busses 32A and 32B by the control signals on control lines 31A and 31B are connected to n bit lines selected from data buses 18C and 18D.

In the read-out mode, control circuit 20 generates output data so as to set write-in signal generator 29 and input buffer 30 inoperative and output buffer 19 operative. In the read-out mode, the operation of the memory device shown in FIG. 7 is substantially the same as that shown in FIG. 3.

In the write-in mode, write-in signal generator 29 and input buffer 30 are rendered operative by output data from control circuit 20. In the write-in mode, the n bit data to be written in is supplied to decoder 15C and/or decoder 15D via input buffer 30 and data rotator 26. At the same time, addresses specifying the write-in address locations of memories 17C and 17D, are supplied from address data circuit 12. Accordingly, n bit data from 2n-bit data supplied from data rotator 26 is written into the specified address locations of memory 17C and/or 17D. The remaining n-bit data is controlled by write-in signal generator 29 so that it will not be supplied to memory 17C or 17D.

Figure 8:
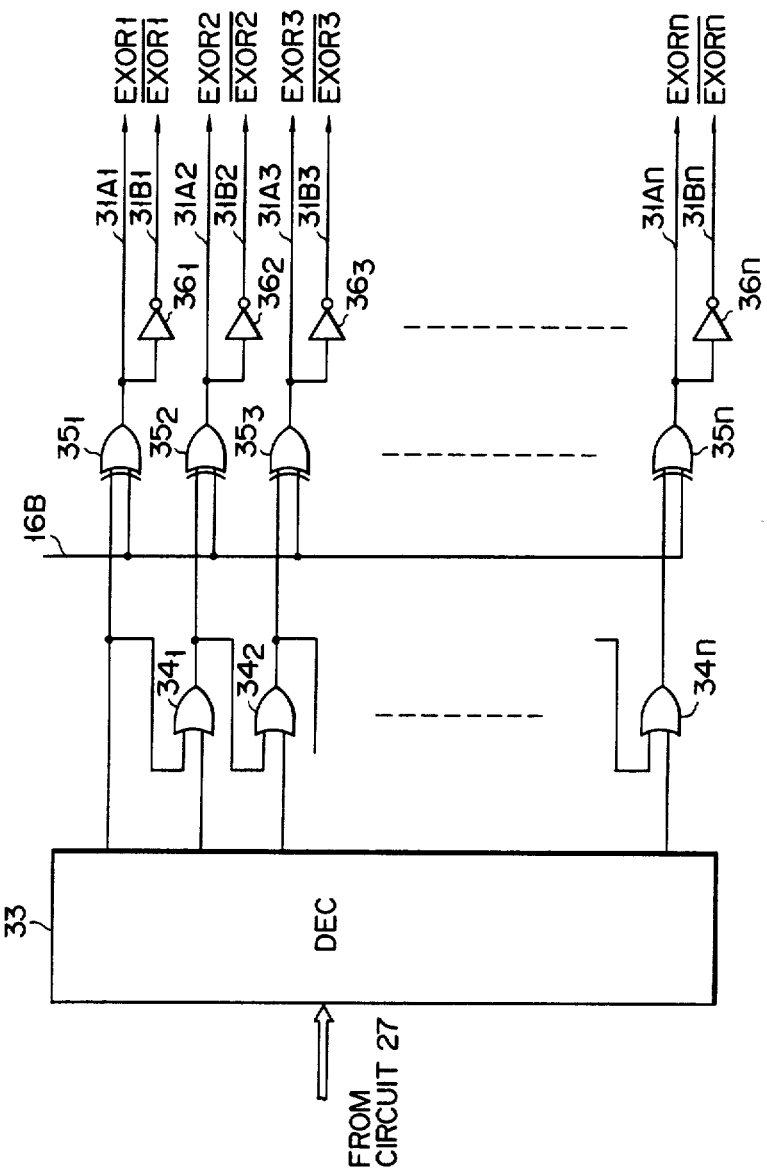
FIG. 8 is a circuit diagram of a write-in signal generator used in the memory device in FIG. 7.

FIG. 8 shows an example of a write-in signal generator 29 as used in FIG. 7. This write-in signal generator 29 has a decoder 33 to decode the bit addresses from bit address latch circuit 27. The most significant bit output of bit address decoder 33 is supplied to one of the input terminals of both NOR gate $34_1$ and exclusive OR gate $35_1$. The output of the second highest order bit from decoder 33 is supplied to a second input terminal of OR gate $34_1$. The output of OR gate $34_1$ is supplied to one of the input terminals of OR gate $34_2$ and to one of the input terminals of exclusive OR gate $35_2$. The signal transfer between OR gates $34_2$ to $34_n$ and exclusive OR gates $35_3$ and $35_n$ is performed in the same way as described above. Address signal $A_0$ from address latch circuit 12 is supplied to the other input terminal of each of exclusive OR gates $35_1$ to $35_n$ via address line 16B. The outputs $EXOR_1$ to $EXOR_n$ of exclusive OR gates $35_1$ to $35_n$ are supplied to column decoder and sense amplifier 15C of the even-number bank via control lines 31A1 to 31An. Output signals $\overline{EXOR_1}$ to $\overline{EXOR_n}$, formed by inverting the outputs of exclusive OR gates $35_1$ to $35_n$ in inverters $36_1$ to $36_n$, are supplied to column decoder and sense amplifier 15D of the odd-number bank via control lines 31B1 to 31Bn.

In the write-in mode, each of the n bits "1" to "n" from first input/output terminals of data rotator 26 is controlled by the logic level of control lines 31A1 to 31An respectively of write-in signal generator 29. In the same manner, each of the n bits "n+1" to "2n" from first input/output terminals are controlled by the logic level of control lines 31B1 to 31Bn of write-in signal generator 29.

In the write-in mode, write-in signal generator 29 sets m(0<m<n) lines from control lines 31A1 to 31An to logic level "1", based on the data from address signal $A_0$ and bit address latch circuit 27. Accordingly, (n-m) lines from control lines 31B1 to 31B1 are set to logic level "1". Because of this, n bit data selected from the 2n-bit data from data rotator 26 is written into a total of "n" memory cells of memory 17C and/or memory 17D.

Let us consider a case, for example, in which the input n-bit data is written into memory 17C. In this case, address signal 2i, including address signal $A_0$ of "0", is latched in address latch circuit 12. Output buffer 19 is rendered inoperative, and input buffer 30 and write-in signal generator 29 are set operative by the control signal from control circuit 20. Input n-bit data is supplied to second input/output terminals "1" to "n" of data rotator 26 via input buffer 30. In the same manner as explained in the embodiment shown in FIG. 3, first input/output terminals "1" to "2n" and second input/output terminals "1" to "n" of data rotator 26 are connected in accordance with bit address data from bit address latch circuit 27. In this case, since it is assumed that n-bit data is stored in memory 17C, second input/output terminals "1" to "n" and first input/output terminals "1" to "n" are connected by bit data BAX from bit address latch circuit 27. Of course, when input n-bit data is stored in memory 17D or separately stored in memories 17C and 17D, second input/output terminals "1" to "n" are connected to the n terminals selected from first input/output terminals "1" to "2n".

In this way, input n-bit data from input buffer 30 is supplied to column decoder 15C via data rotator 26 and n bit lines 32A. In this case, data "0" from first input/output terminals "n+1" to "2n" of data rotator 26 is supplied to column decoder 15D via n bit lines 32B. Write-in signal generator 29, in response to address data BAX from bit address latch circuit 27, and address signal $A_0$ of "0", renders n bit lines 32A active, and n bit lines 32B inactive. As a result, n bit lines 32A are connected to n bit lines selected from data bus 18C by address signals $A_1$ to $A_{p-1}$ from address latch circuit 12. Then n-bit data from data rotator 26 is written into n memory cells of memory 17C which are in the columns selected by address signals $A_1$ to $A_{p-1}$, and in the rows selected by address signals Ap to Am. Also, since n bit lines 32B are made inactive, the n-bit of "0" from data rotator 26 is not written into memory 17D.

In the embodiment described above, without any restriction by the word boundary, the successive bits in one word can written into memories 17C and 17d, directly or without any logical operation of the address signal.

While this invention has been described using same specific embodiments, it is evident that this invention is not limited to these embodiments only. For example, in the above embodiment, shift data, corresponding to the difference between the top address of the preceding word area of the two word areas, and the top address of the read-out or write-in data, is stored in bit address latch circuit 27. However, in bit address latch circuit 27, when the top address of the preceding word area has an even-numbered column address, shift data corresponding to the difference between the top address of the preceding word area and the top address of the read-out or write-in data may be stored. When the preceding word area has an odd-numbered column address, shift data corresponding to the difference between the top address of the succeeding word area and the top address of the read-out or write-in data, and the added value of "n" (one word), may be stored. In this case, it becomes unnecessary to supply address signal $A_0$ to data rotator 26.

Also, even if address signal $A_0$ is supplied to column decoders 15B or 15D instead of 15A or 15C, the same operation as that of the embodiment described above can be obtained.

What is claimed is:

1. A semiconductor memory device comprising:

address signal generating means for generating address signals including row and column signals and an additional address signal to indicate if the column address is even- or odd-numbered;

even- and odd-numbered bank memory means, each having a plurality of word areas and each word area including n bit areas;

row decoder means connected to said address signal generating means and to said even- and odd-numbered bank memory means for responding to the row address signal from said address signal generating means to specify the row address positions in said even-numbered and odd-numbered bank memory means;

column decoder means, connected to said address signal generating means and to said even- and odd-numbered bank memory means, and which, in response to the column and additional address signals, respectively specifies the column address location [2j] or [2j+2] in the even-numbered bank memory means and specifies the column address location [2j+1] of said odd-numbered bank memory means when said column and additional address signals indicate column address (2j) or (2j+1);

control data generating means for generating control data representing the amount of data rotation corresponding to the number of bits less than 2n bits; and data rotating means connected to said column decoder means via 2n bit lines and to said control data generating means, and in accordance with the control data from said control data generating means, said data rotating means selectively connecting the 2n bit lines connected to said column decoder means, to n input/output bit, thereby permitting n-bit data to be transferred between said even- and odd-numbered bank memory means and said n input/output bit lines via said data rotating means.

2. A semiconductor memory device according to claim 1, wherein said column decoder means includes a first decoder, which, in response to the column and additional address signals, specifies the column address location [2j] or [2j+2] in said even-numbered bank memory means when said column and additional address signals indicate column address (2J) or (2j+1), and a second decoder which, in response to the column address signal, specifies the column address location [2j+1] in said odd-numbered bank memory means when said column and additional address signals indicate column address (2j) or (2j+1).

3. A semiconductor memory device according to claim 2, wherein said control data generating means includes latch means, for supplying to said data rotating means shift data corresponding to the difference between the top address of the preceding word area of the two word areas specified by said column decoding means in said even-numbered and odd-numbered bank memory means, and the top address of data written into or read out of this word area to said rotating means, and means for supplying the additional address signal to said data rotating means.

4. A semiconductor memory device according to claim 3, further comprising write-in control means, which in the write-in mode, in accordance with control data from said control data generating means, sets n bit lines out of the 2n bit lines connected to said column decoder means into the active state, and the remaining n bit lines into the inactive state.

5. A semiconductor memory device according to claim 2, further comprising write-in control means, which in the write-in mode, in accordance with control data from said control data generating means, sets n bit lines out of the 2n bit lines connected to said column decoder means into the active state, and the remaining n bit lines into the inactive state.

6. A semiconductor memory device according to claim 1, further comprising write-in control means, which in the write-in mode, in accordance with control data from said control data generating means, sets n bit lines out of the 2n bit lines connected to said column decoder means into the active state, and the remaining n bit lines into the inactive state.

7. A semiconductor memory device according to claim 1, wherein said control data generating means includes latch means, for supplying to said data rotating means shift data corresponding to the difference between the top address of the preceding word area of the two word areas specified by said column decoding mans in said even-numbered and odd-numbered bank memory means, and the top address of data written into or read out of this word area to said rotating means, and means for supplying the additional address signal to said data rotating means.

8. A semiconductor memory device comprising:

address signal generating means for generating address signals including an additional address signal to indicate whether the column address is even- or odd-numbered;

even- and odd-numbered bank memory means, each having a plurality of word area and each word area including a number "n" of bit areas;

row decoder means connected to said address signal generating means and to said even- and odd-numbered bank memory means and which, in response to the row address signal from said address signal generating means, specifies the row address positions in said even- and odd-numbered bank memory means;

column decoder means connected to said address signal generating means and to said even- and odd-numbered bank memory means and which, in response to the column and additional address signals, specifies adjacent column address positions in said even- and odd-numbered bank memory means;

control data generating means for generating control data which indicates the amount of data rotation corresponding to the number of bits less than 2n bits;

data rotating means connected to said column decoder means via the 2n bit lines and to said control data generating means, and in accordance with the control data from said control data generating means, selectively connecting the 2n bit lines connected to said column decoder means, to n input/output bit lines, thereby permitting n-bit data to be transferred between said even- and odd-numbered bank memory means and said n input/output bit lines via said rotating means.

9. A semiconductor memory device comprising:

address signal generating means for generating address signals including row and column signals and an additional address signal to indicate if the column address is even- or odd-numbered;

even- and odd-numbered bank memory means, each having a plurality of word area and each word area including n bit areas;

row decoder means connected to said address signal generating means and even- and odd-numbered bank memory means for responding to the row address signal from said address signal generating means to specify the row address positions of said even-numbered and odd-numbered bank memory means;

column decoder means which is connected to said address signal generating means and even- and odd-numbered bank memory means, and which, in response to the column and additional address signals, respectively specifies the column address location [2j] or [2j+2] in the even-numbered bank memory means and specifies the column address location [2j+1] in said odd-numbered bank memory means when said column and additional address signals indicate column address (2j) or (2j+1), thereby causing n-bit data to be read out from the specified address positions of each of said even- and odd-numbered bank memory means;

control data generating means for generating control data representing the amount of data rotation corresponding to the number of bits less than 2n bits; and data rotating means connected to receive the control data from said control data generating means and connected to said column decoder means via 2n bit lines, and in accordance with the control data from said control data generating means, said data rotating means selectively connecting the 2n bit lines connected to said column decodere means to n output bit lines, thereby permitting n bits out of the 2n-bit data from said even-and odd-numbered bank memory means to be output via said n output bit lines.

* * * * *